(12) United States Patent
Zhang et al.

(10) Patent No.: US 9,543,331 B2
(45) Date of Patent: Jan. 10, 2017

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN); Shi Shu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/435,877

(22) PCT Filed: Sep. 20, 2014

(86) PCT No.: PCT/CN2014/086999
§ 371 (c)(1),
(2) Date: Apr. 15, 2015

(87) PCT Pub. No.: WO2015/172492
PCT Pub. Date: Nov. 19, 2015

(65) Prior Publication Data
US 2015/0372011 A1    Dec. 24, 2015

(30) Foreign Application Priority Data

May 13, 2014  (CN) .......................... 2014 1 0200290

(51) Int. Cl.
*H01L 27/12*    (2006.01)
*G02F 1/1343*   (2006.01)
*G02F 1/1362*   (2006.01)

(52) U.S. Cl.
CPC ....... *H01L 27/124* (2013.01); *G02F 1/134363* (2013.01); *G02F 1/136209* (2013.01);
(Continued)

(58) Field of Classification Search
CPC .... H01L 27/12; H01L 27/124; H01L 27/1262; H01L 29/786; G02F 1/134363; G02F 1/136209; G02F 1/136227
See application file for complete search history.

(56) References Cited

U.S. PATENT DOCUMENTS

2004/0155245 A1     8/2004   Okumura
2011/0242468 A1*   10/2011   Choi ........................ C08G 8/12
                                                    349/129
(Continued)

FOREIGN PATENT DOCUMENTS

CN    102193229 A    9/2011
CN    102998725 A    3/2013
(Continued)

OTHER PUBLICATIONS

Jan. 28, 2015—(WO)—International Search Report and Written Opinion Appn PCT/CN2014/086999 with English Tran.
(Continued)

*Primary Examiner* — Fazli Erdem
(74) *Attorney, Agent, or Firm* — Banner & Witcoff, Ltd.

(57) ABSTRACT

An array substrate and manufacturing method thereof, and a display device are capable of preventing light reflection from a drain electrode, and guaranteeing the display effect of the display device. The array substrate includes a drain electrode of a thin film transistor unit, an insulating layer and a pixel electrode. The insulating layer is located between the drain electrode and the pixel electrode, and has a via hole formed therein, and the drain electrode and the pixel electrode are connected through the via hole. A surface of the pixel electrode at the via hole is a rough face.

17 Claims, 4 Drawing Sheets

(52) U.S. Cl.
CPC .... *G02F 1/136227* (2013.01); *H01L 27/1262* (2013.01); *G02F 2001/136222* (2013.01); *H01L 2924/0002* (2013.01)

(56) References Cited

U.S. PATENT DOCUMENTS

| | | | |
|---|---|---|---|
| 2012/0235175 A1 | 9/2012 | Prushinskiy et al. | |
| 2012/0249940 A1* | 10/2012 | Choi | G02F 1/133753 349/123 |
| 2013/0228786 A1* | 9/2013 | Park | H01L 51/5268 257/72 |

FOREIGN PATENT DOCUMENTS

| | | | |
|---|---|---|---|
| CN | 103346159 A | 10/2013 | |
| CN | 103985717 A | 8/2014 | |
| KR | 20070111029 A | 11/2007 | |

OTHER PUBLICATIONS

Feb. 29, 2016—(CN)—First Office Action Appn 201410200290.4 with English Tran.
Oct. 14, 2016—(CN)—Second Office Action Appn 201410200290.4 with English Tran.

\* cited by examiner

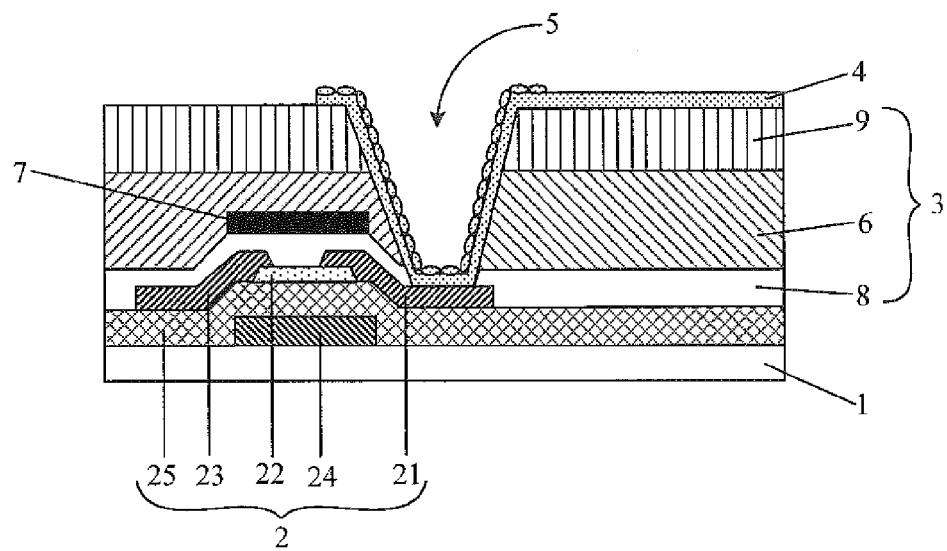

FIG. 1

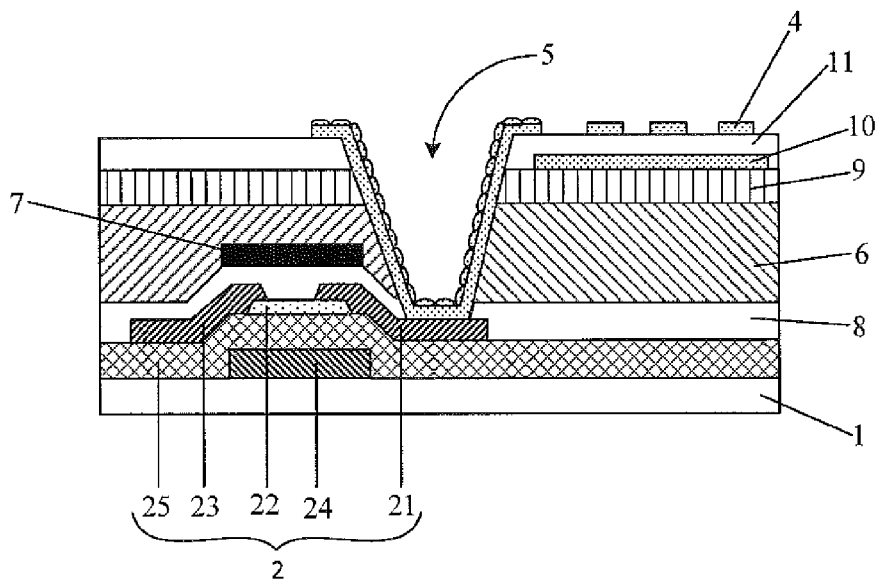

FIG. 2

| forming drain electrode of thin film transistor unit, insulating layer and pixel electrode, wherein, the insulating layer lies between the drain electrode and the pixel electrode and has a via hole formed therein, and the drain electrode and the pixel electrode are connected through the via hole | S101 |

| treating a surface of the pixel electrode at the via hole to be a rough face | S102 |

FIG. 3

ARRAY SUBSTRATE AND MANUFACTURING METHOD THEREOF, DISPLAY DEVICE

The application is a U.S. National Phase Entry of International Application No. PCT/CN2014/086999 filed on Sep. 20, 2014, designating the United States of America and claiming priority to Chinese Patent Application No. 201410200290.4 filed on May 13, 2014. The present application claims priority to and the benefit of the above-identified applications and the above-identified applications are incorporated by reference herein in their entirety.

TECHNICAL FILED

Embodiments of the present invention relate to an array substrate and manufacturing method thereof, a display device.

BACKGROUND

As people's demand on the light transmittance, resolution, power consumption and so on of display devices are higher and higher in recent years, all of the display devices are developing toward the direction of high transmittance, high resolution, low power consumption, etc. The higher the resolution is, the smaller the size of each pixel unit is. When the side length of a pixel unit is changed from several tens of micrometers to a dozen micrometers, if the width of a black matrix for partitioning pixel units still remains unchanged, then relative to pixel units, the black matrix will become apparent, and this will affect the display effect of the display device.

Therefore, an integrated technology (namely, Color Filter on Array, briefly called as COA) in which color filters and an array substrate are integrated together emerges as times require. Because a black matrix is situated on an array substrate in this case, while the width of the black matrix is appropriately decreased, it can also be ensured that gate lines, data lines, thin film transistor units and other structures in need of shelter against light can be fully shaded by the black matrix. Moreover, the possibility that a light leakage phenomenon occurs is reduced, and the display effect of the display device is guaranteed while the resolution and transmittance are enhanced.

As discovered by inventor(s), after the black matrix is integrated onto the array substrate, in view of the fact that the black matrix is usually situated between a drain electrode of a thin film transistor and a pixel electrode, in order to achieve the electrical connection between the drain electrode and the pixel electrode, it is required that a via hole be formed in the black matrix. This via hole will have an influence on the shading effect of the black matrix on the drain electrode, and this causes the drain electrode to reflect light from the via hole side. Thus, the display effect of the display device is degraded.

SUMMARY

One of the technical problems to be solved by the present invention is to provide an array substrate and manufacturing method thereof, a display device, capable of preventing light reflection from a drain electrode, and ensuring the display effect of the display device.

According to an embodiment of the invention, there is provided an array substrate, including a base substrate;

a drain electrode of a thin film transistor unit, an insulating layer and a pixel electrode on the base substrate, wherein, the insulating layer is located between the drain electrode and the pixel electrode, the insulating layer has a via hole formed therein, and the drain electrode and the pixel electrode are connected through the via hole, a surface of the pixel electrode at the via hole is a rough face.

In an example, the surface of the pixel electrode at the via hole is subjected to a plasma treatment.

In an example, the plasma includes hydrogen plasma or silane plasma.

In an example, the pixel electrode is made of a transparent conductive thin film of an indium oxide based metal oxide.

In an example, the rough face of the pixel electrode includes metal indium in big particles.

In an example, an orthographic projection of the drain electrode of the thin film transistor unit on the base substrate falls within a scope of orthographic projection of the rough face of the pixel electrode.

According to another embodiment of the invention, there is provided a display device, which includes the array substrate according to any embodiment of the invention.

According to still another embodiment of the invention, there is provided a manufacturing method of an array substrate, which includes:

forming a drain electrode of a thin film transistor unit, an insulating layer and a pixel electrode on a base substrate, wherein, the insulating layer is located between the drain electrode and the pixel electrode, and has a via hole formed therein, and the drain electrode and the pixel electrode are connected through the via hole;

treating a surface of the pixel electrode at the via hole to be a rough face.

In an example, treating the surface of the pixel electrode at the via hole to be the rough face includes:

treating the pixel electrode at the via hole with plasma, so that the surface of the pixel electrode at the via hole is the rough face.

In an example, the plasma includes hydrogen plasma or silane plasma.

In an example, the pixel electrode is made of a transparent conductive thin film of an indium oxide based metal oxide.

In an example, the rough face of the pixel electrode includes metal indium in big particles.

In an example, an orthographic projection of the drain electrode of the thin film transistor unit on the base substrate falls within a scope of orthographic projection of the rough face of the pixel electrode.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

FIG. 1 is a structurally schematic view 1 illustrating an array substrate in an embodiment of the invention;

FIG. 2 is a structurally schematic view 2 illustrating an array substrate in an embodiment of the invention;

FIG. 3 is a schematically flowchart illustrating a manufacturing method of an array substrate in an embodiment of the invention;

DETAILED DESCRIPTION

Figure 4:
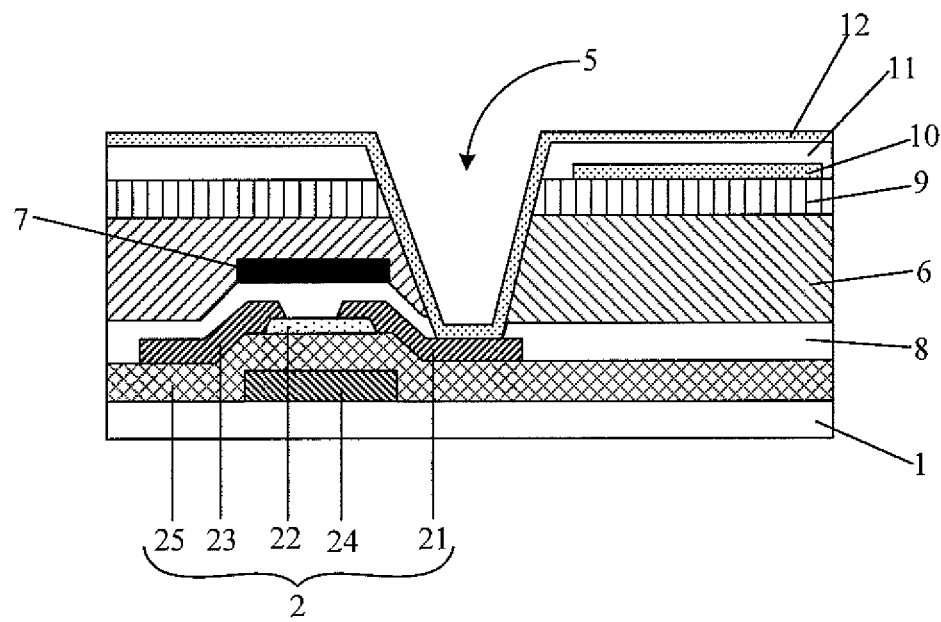
FIG. 4 is a structurally schematic view 3 illustrating an array substrate in an embodiment of the invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

First Embodiment

According to an embodiment of the invention, there is provided an array substrate. As illustrated in FIG. 1, the array substrate includes:

a drain electrode 21 of a thin film transistor unit 2, an insulating layer 3 and a pixel electrode 4 that are located on the base substrate 1. The insulating layer 3 is located between the drain electrode 21 and the pixel electrode 4, and has a via hole 5 formed therein, and the drain electrode 21 and the pixel electrode 4 are connected through the via hole 5. A surface of the pixel electrode 4 at the via hole 5 is a rough face.

In embodiments of the invention, by adopting a COA technology, a color film 6, a black matrix 7 and the thin film transistor unit 2 are all formed on the same base substrate 1. Regarding the thin film transistor unit 2, it is possible that transmission of electrical signals is achieved between a source electrode 23 and the drain electrode 21 mainly by forming a conductive channel in an active layer 22. While illumination will have an influence on the capacity of transmitting carrier of the conductive channel within the active layer 22, and in turn, the working effect of the thin film transistor unit 2 is affected. Consequently, in general, it is required that the black matrix 7 be disposed at the location corresponding to the active layer 22 of the thin film transistor unit 2, and moreover, in order to ensure an aligning accuracy between the color film 6 and the black matrix 7, the color film 6 is directly formed on the black matrix 7.

Specifically, in an embodiment of the invention, the insulating layer 3 at least includes a first insulating layer 8, a second insulating layer 9 and a color film 6 that are located on the thin film transistor unit 2, wherein, the first insulating layer 8 directly covers the thin film transistor unit 2, and is usually called as a passivation layer. Use of the passivation-layer process not only enhances the capability of the display device in resisting rigorous circumstance, but also helps to improve the performance of photoelectric parameters of the thin film transistor unit 2. Similarly, the second insulating layer 9 is located on the color film 6, and can be called as a planarizing layer, and provision of the planarizing layer facilitates execution of subsequent machining steps of the array substrate.

In addition, as illustrated in FIG. 1, for assuring a shading effect of the black matrix 7 on the active layer 22, the black matrix 7 is directly disposed on the first insulating layer 8.

The black matrix 7 may be produced by choosing a black or dark resin. In the course of producing the black matrix 7, a layer of shading material is firstly deposited on the formed first insulating layer 8, and after that, a plurality of black matrices 7 corresponding to thin film transistor units 2 are formed by a patterning process that includes etching. Therefore, in order to cut down the fabricating flow of the array substrate, a black photoresist is preferably used for production, and by utilizing the photosensitive property of the photoresist, use of a photoresist can be omitted upon manufacture of the black matrix 7.

Owing to adoption of the COA technology, the black matrix 7 is placed on the array substrate, and moreover, for ensuring the connection between the pixel electrode and the drain electrode, the drain electrode 21 cannot be shaded by the black matrix 7 completely, and the via hole 5 penetrating the insulating layer 3 makes a part of the drain electrode 21 be exposed. Although the via hole 5 is also covered by a layer of pixel electrode 4 connected to the drain electrode 21, a transparent conductive thin film of indium tin oxide (ITO), indium zinc oxide (IZO) or other metal oxide in indium oxide based metal oxides (metal oxides in the family of indium oxide) that is doped with one or more selected from the group consisting of tin, zinc, tantalum, antimony and other elements is usually used for the pixel electrode 4 (preferably, the transparent conductive thin film in the invention is an ITO thin film), and then, light from the outside may be specularly reflected by a part of the drain electrode 21 in correspondence with the via hole 5. Therefore, the display effect of the display device is affected.

Consequently, in embodiments of the invention, in order to prevent the drain electrode 21 from being specularly reflected by a part of the via hole 5 that has been exposed to the outside, a surface of the pixel electrode at the via hole is treated to be a rough face. With the rough face, it is possible that the transmittance of the pixel electrode at the via hole is reduced, and light in contact with the drain electrode is decreased. Moreover, it is also possible that the transmittance of light reflected by the drain electrode is reduced, and the reflective effect of the drain electrode on external lights is decreased. Thus, the display effect of the display device is improved.

In the technical solution of the present embodiment, a surface of the pixel electrode at the via hole of the insulating layer is treated to be a rough face. With the rough face, it is possible that the transmittance of the pixel electrode at the via hole is reduced, and light in contact with the drain electrode is decreased. Moreover, it is also possible that the transmittance of light reflected by the drain electrode is reduced, and the reflective effect of the drain electrode on external lights is decreased. Thus, the display effect of the display device is improved. For example, in order to decrease light in contact with the drain electrode better, and to reduce the transmittance of light reflected by the drain electrode, the orthographic projection of the drain electrode of the thin film transistor unit on the base substrate falls within the scope of the orthographic projection of the rough face of the pixel electrode.

For example, a surface of the pixel electrode 4 at the via hole 5 is subjected to plasma treatment, and the treating method is simple, convenient, and easy to implement.

In embodiments of the invention, the plasma includes hydrogen plasma or silane plasma. The hydrogen plasma is a preferred item of embodiments of the invention owing to its characteristic of being safe and non-toxic. Specifically, hydrogen plasma may create a reduction reaction with indium oxide in a transparent conductive thin film of a metal oxide in the family of indium oxide, so as to produce metal indium and water, and the metal indium precipitates from the surface of the transparent conductive thin film of a metal oxide in the family of indium oxide to form big particles, resulting in degradation in surface flatness of the formed device. A rough surface can act to strengthen the diffusive reflection effect of light, thereby reducing the transmittance of the transparent conductive thin film of a metal oxide in the family of indium oxide. That is to way, the rough face of the pixel electrode includes metal indium in big particles. The water produced by reaction may turn the color of the transparent conductive thin film of a metal oxide in the family of indium oxide that is originally transparent into white, and an atomization phenomenon occurs, so that transmittance of the transparent conductive thin film of a metal oxide in the family of indium oxide is further degraded.

For example, the range of radio frequency power of hydrogen plasma may be 500 W to 5000 W, the time range for processing may be 5 to 30 seconds, and the pressure range may be 50 to 200 mTorr (1 Torr≈133.322 Pa).

Obviously, the thin film transistor unit 2 in the array substrate illustrated in FIG. 1 is of bottom-gate type, and that is, the structure of the thin film transistor unit 2 includes a gate electrode 24, a gate insulating layer 25, a source electrode 23 and a drain electrode 21 disposed in the same layer and insulated from each other, and an active layer 22 for connecting the source electrode 23 and the drain electrode 21 from bottom to up. Similarly, the thin film transistor unit 2 may also be of top-gate type. The structure of a top-gate thin film transistor unit 2 is nearly the opposite of that of bottom type illustrated in FIG. 1. Namely, the top-gate thin film transistor unit 2 includes a source electrode 23 and a drain electrode 21 disposed in the same layer and insulated from each other, an active layer for connecting the source electrode 23 and the drain electrode 21, a gate insulating layer 25 and a gate electrode 24 from bottom to top.

Obviously, the array substrate illustrated in FIG. 1 is a Twisted Nematic (briefly called as TN) mode array substrate with a COA process. On this basis, we may consider making an improvement on the structure of the array substrate illustrated in FIG. 1. For example, as illustrated in FIG. 2, based on the array substrate illustrated in FIG. 1, the array substrate further includes a common electrode 10 in cooperation with the pixel electrode 4, and a third insulating layer 11 located between the pixel electrode 4 and the common electrode 10. In this case, the array substrate is an array substrate of Advanced Super Dimension Switch (briefly called as ADS) mode with a COA process. Obviously, the pixel electrode 4 in FIG. 2 is located over the common electrode 10, and for the sake of achieving the connection between the pixel electrode 4 and the drain electrode 21, the via hole 5 also needs to penetrate the third insulating layer 11.

According to the embodiment of the invention, there is further provided a display device, which includes any of the array substrates as stated above. Specifically, the display device may be a liquid crystal panel, a liquid crystal television, a liquid crystal display, a digital photo frame, a cell phone, a tablet computer or any other product or component having a display function.

Second Embodiment

According to an embodiment of the invention, there is provided a manufacturing method of an array substrate. As illustrated in FIG. 3, the manufacturing method of the array substrate includes:

Step S101, a drain electrode of a thin film transistor unit, an insulating layer and a pixel electrode are formed. The insulating layer is located between the drain electrode and the pixel electrode, and has a via hole formed therein, and the drain electrode and the pixel electrode are connected through the via hole;

Step S102, a surface of the pixel electrode at the via hole is treated to be a rough face.

The step S102 includes that, the pixel electrode at the via hole is treated by plasma, so that a surface of the pixel electrode at the via hole is a rough face.

For example, when the surface of the pixel electrode 4 at the via hole 54 is treated, a protective layer needs to be formed by using a photoresist or the like, so as to protect the pixel electrode without the necessity of being treated, and to expose the pixel electrode in need of being treated. Hereinafter, it will be described concretely.

A transparent conductive thin film 12 is formed on an array substrate with a thin film transistor unit 2, a first insulating layer 8, a black matrix 7, a color film 6, a second insulating layer 9, a common electrode 10 and a third insulating layer 11 sequentially formed thereon, and is connected to a drain electrode 21 of the thin film transistor unit 2 through a via hole 5 that penetrates the third insulating layer 11, the second insulating layer 9, the color film 6 and the first insulating layer 8 in sequence, as illustrated in FIG. 4.

Figure 5:
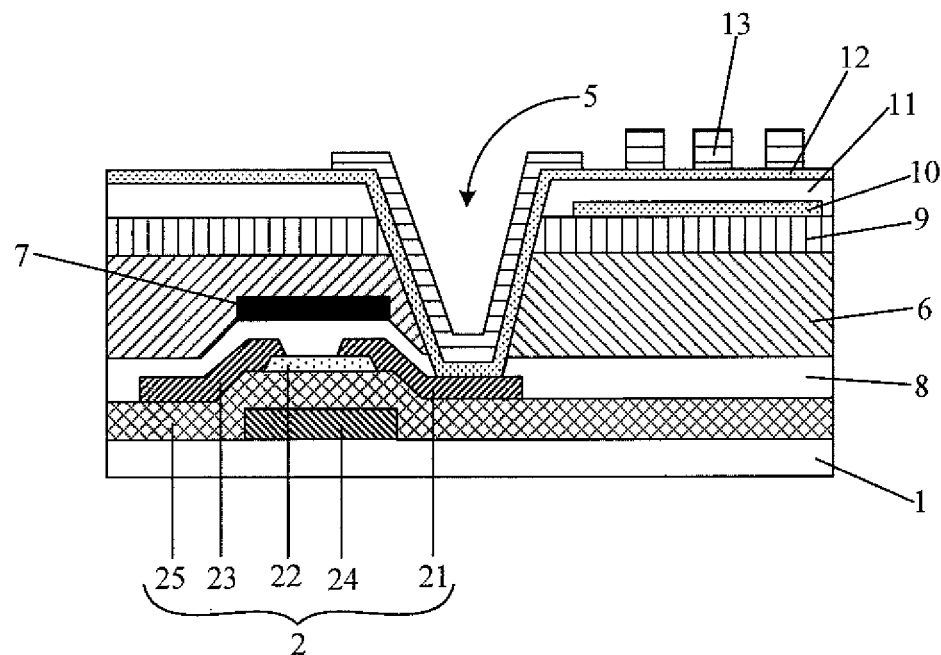
FIG. 5 is a structurally schematic view 4 illustrating an array substrate in an embodiment of the invention.
Figure 6:
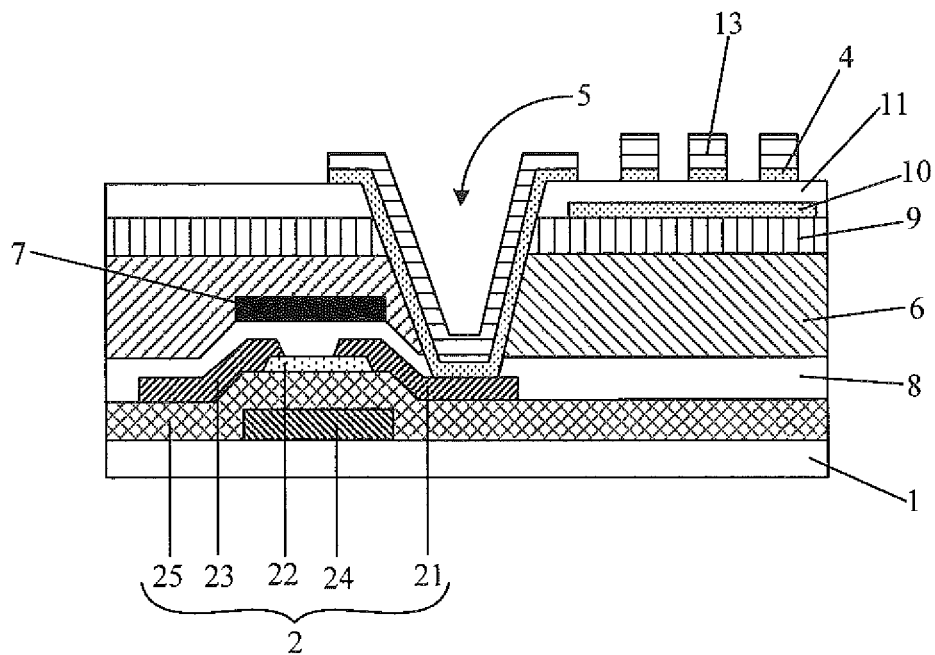
FIG. 6 is a structurally schematic view 5 illustrating an array substrate in an embodiment of the invention.
Figure 7:
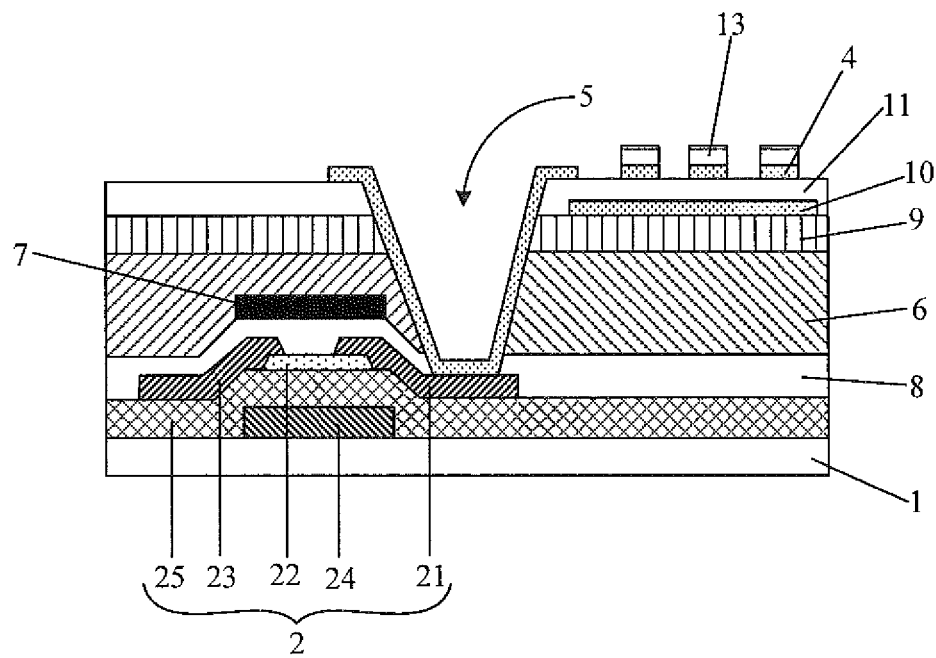
FIG. 7 is a structurally schematic view 6 illustrating an array substrate in an embodiment of the invention.
Figure 8:
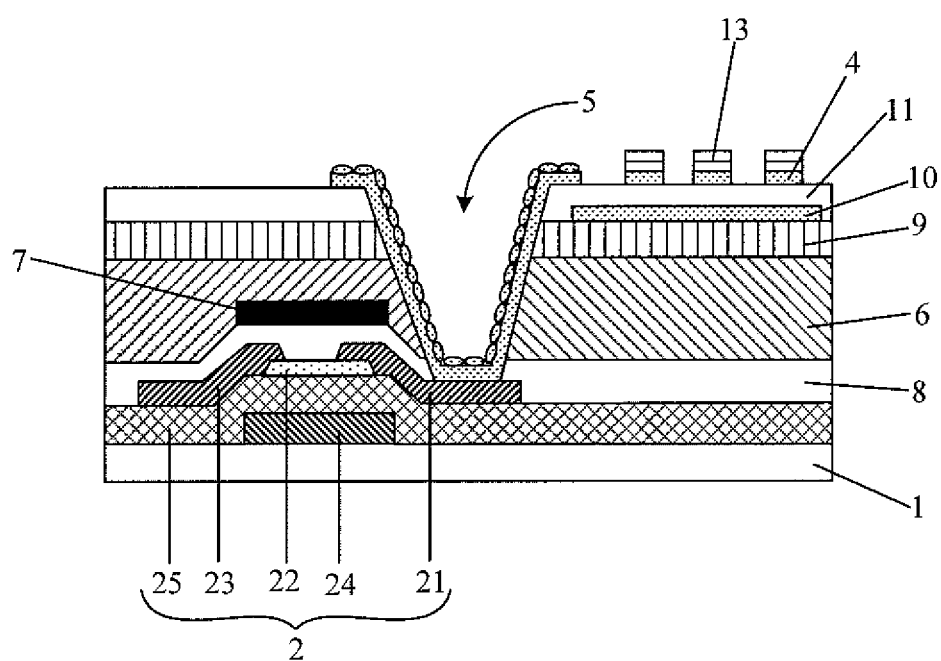
FIG. 8 is a structurally schematic view 7 illustrating an array substrate in an embodiment of the invention.

On the basis of FIG. 4, with a half-tone mask, a photoresist layer 13 having the pattern of a pixel electrode 4 is formed over the transparent conductive thin film, as illustrated in FIG. 5, and a patterning process is conducted, so as to form the comb-tooth-shaped pixel electrode 4, as illustrated in FIG. 6. The photoresist layer 13 at the via hole 5 is removed by an ashing process, so that the pixel electrode 4 at the via hole 5 is exposed to the outside, as illustrated in FIG. 7, and at this time, the pixel electrode 4 at the via hole 5 may be treated by using plasmas, so that a surface of the pixel electrode 4 turns into a rough face, as illustrated in FIG. 8. Finally, the remaining photoresist layer 13 on the array substrate is removed, and the structure of the array substrate illustrated in FIG. 2 is formed.

For example, the plasma includes hydrogen plasma or silane plasma.

Descriptions made above are merely exemplary embodiments of the invention, but are not used to limit the protection scope of the invention. The protection scope of the invention is determined by attached claims.

This application claims the benefit of priority from Chinese patent application No. 201410200290.4, filed on May 13, 2014, the disclosure of which is incorporated herein in its entirety by reference as a part of the present application.

The invention claimed is:

1. An array substrate, comprising:
a base substrate;
a drain electrode of a thin film transistor unit, an insulating layer and a pixel electrode on the base substrate, wherein, the insulating layer is located between the drain electrode and the pixel electrode, the insulating layer has a via hole formed therein, and the drain electrode and the pixel electrode are connected through the via hole, a surface of the pixel electrode at the via hole is a rough face, wherein an orthographic projection of the drain electrode of the thin film transistor on the base substrate falls completely within a scope of orthographic projection of the rough face of the pixel electrode.

2. The array substrate according to claim 1, wherein, the surface of the pixel electrode at the via hole is subjected to a plasma treatment.

3. The array substrate according to claim 2, wherein, the plasma includes hydrogen plasma or silane plasma.

4. The array substrate according to claim 1, wherein, the pixel electrode is made of a transparent conductive thin film of an indium oxide based metal oxide.

5. The array substrate according to claim 4, wherein, the rough face of the pixel electrode includes metal indium in big particles.

6. A display device, comprising the array substrate according to claim 1.

7. A manufacturing method of an array substrate, comprising:

forming a drain electrode of a thin film transistor unit, an insulating layer and a pixel electrode on a base substrate, wherein, the insulating layer is located between the drain electrode and the pixel electrode, and has a via hole formed therein, and the drain electrode and the pixel electrode are connected through the via hole;

treating a surface of the pixel electrode at the via hole to be a rough face, wherein an orthographic projection of the drain electrode of the thin film transistor on the base substrate falls completely within a scope of orthographic projection of the rough face of the pixel electrode.

8. The manufacturing method of the array substrate according to claim 7, wherein, treating the surface of the pixel electrode at the via hole to be the rough face includes:

treating the pixel electrode at the via hole with plasma, so that the surface of the pixel electrode at the via hole is the rough face.

9. The manufacturing method of the array substrate according to claim 8, wherein, the plasma includes hydrogen plasma or silane plasma.

10. The manufacturing method of the array substrate according to claim 7, wherein, the pixel electrode is made of a transparent conductive thin film of an indium oxide based metal oxide.

11. The manufacturing method of the array substrate according to claim 10, wherein, the rough face of the pixel electrode includes metal indium in big particles.

12. The array substrate according to claim 2, wherein, the pixel electrode is made of a transparent conductive thin film of an indium oxide based metal oxide.

13. The array substrate according to claim 3, wherein, the pixel electrode is made of a transparent conductive thin film of an indium oxide based metal oxide.

14. The display device according to claim 6, wherein, the surface of the pixel electrode at the via hole is subjected to a plasma treatment.

15. The display device according to claim 14, wherein, the plasma includes hydrogen plasma or silane plasma.

16. The display device according to claim 6, wherein, the pixel electrode is made of a transparent conductive thin film of an indium oxide based metal oxide.

17. The display device according to claim 16, wherein, the rough face of the pixel electrode includes metal indium in big particles.

* * * * *